(12) United States Patent
Ahn et al.

(10) Patent No.: US 10,739,816 B2
(45) Date of Patent: Aug. 11, 2020

(54) HOUSING, METHOD OF MANUFACTURING THE SAME, AND ELECTRONIC DEVICE INCLUDING THE SAME

(71) Applicant: Samsung Electronics Co., Ltd., Gyeonggi-do (KR)

(72) Inventors: Byoung-Ju Ahn, Gyeonggi-do (KR); Doheang Kang, Jeju-do (KR); Jungchul Kim, Gyeonggi-do (KR); Soo Jin Park, Gyeonggi-do (KR); Young Jae Lee, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 98 days.

(21) Appl. No.: 15/131,096

(22) Filed: Apr. 18, 2016

(65) Prior Publication Data
US 2016/0313763 A1 Oct. 27, 2016

(30) Foreign Application Priority Data

Apr. 21, 2015 (KR) .................. 10-2015-0056161

(51) Int. Cl.
*C23C 14/06* (2006.01)
*H04M 1/02* (2006.01)
(Continued)

(52) U.S. Cl.
CPC ......... *G06F 1/1626* (2013.01); *B29D 99/006* (2013.01); *B32B 37/14* (2013.01);
(Continued)

(58) Field of Classification Search
CPC ............ B32B 2457/00; B32B 2037/14; B32B 2037/246; B32B 38/10; B32B 43/006; G06F 1/1626; C23C 14/06; H04M 1/0283
See application file for complete search history.

(56) References Cited

U.S. PATENT DOCUMENTS 5,015,537 A * 5/1991 Uchiyama ................. B44F 1/08
428/336
5,728,994 A * 3/1998 Hutton ............... B23K 26/0661
219/121.69
(Continued)

FOREIGN PATENT DOCUMENTS

CN 101594755 A 12/2009
CN 102958311 A 3/2013
(Continued)

OTHER PUBLICATIONS

Machine translation of CN103516843A.*
(Continued)

*Primary Examiner* — Jose I Hernandez-Kenney
(74) *Attorney, Agent, or Firm* — Cha & Reiter, LLC

(57) ABSTRACT

A method for manufacturing a housing, comprising: laminating a first deposition layer on a preform; laminating an intermediate layer on the first deposition layer; laminating a second deposition layer on the intermediate layer; applying a color paint layer on the second deposition layer; delaminating at least some of the color paint layer and the second deposition layer to form at least one delaminated area; and forming a printing layer in the delaminated area, wherein the first deposition layer is visible through at least some areas of the printing layer.

10 Claims, 17 Drawing Sheets

(51) Int. Cl.
*G06F 1/16* (2006.01)
*B29D 99/00* (2010.01)
*B44C 3/00* (2006.01)
*B32B 37/14* (2006.01)
*B32B 43/00* (2006.01)
*B32B 37/24* (2006.01)
*B32B 38/10* (2006.01)

(52) U.S. Cl.
CPC ............ *B32B 43/006* (2013.01); *B44C 3/005* (2013.01); *C23C 14/06* (2013.01); *H04M 1/0283* (2013.01); *B32B 38/10* (2013.01); *B32B 2037/246* (2013.01); *B32B 2457/00* (2013.01)

(56) References Cited

U.S. PATENT DOCUMENTS

| | | | |
|---|---|---|---|
| 2010/0279043 A1* | 11/2010 | Hsu | B05D 5/06 428/35.7 |
| 2011/0048754 A1 | 3/2011 | Xiong et al. | |
| 2011/0253412 A1* | 10/2011 | Shin | B44F 1/045 174/50 |
| 2012/0003441 A1* | 1/2012 | Chen | B32B 27/08 428/206 |
| 2013/0049557 A1 | 2/2013 | Ho et al. | |
| 2013/0052376 A1 | 2/2013 | Ho et al. | |
| 2013/0142991 A1* | 6/2013 | Cao | C23C 14/0015 428/138 |
| 2014/0113089 A1* | 4/2014 | Liu | C23C 14/20 428/34.6 |
| 2014/0118903 A1 | 5/2014 | Hwang et al. | |
| 2014/0248506 A1 | 9/2014 | McCormack et al. | |
| 2014/0323185 A1* | 10/2014 | Lee | H04B 1/3888 455/575.8 |
| 2015/0339564 A1* | 11/2015 | Herslow | B32B 33/00 235/488 |

FOREIGN PATENT DOCUMENTS

| | | | |
|---|---|---|---|
| CN | 103516843 A | * | 1/2014 |
| CN | 103516843 A | | 1/2014 |
| CN | 103802577 A | | 5/2014 |
| KR | 10-2015-0011692 A | | 2/2015 |
| WO | 2009/144361 A1 | | 12/2009 |
| WO | 2012/135529 A1 | | 10/2012 |

OTHER PUBLICATIONS

"Consist of." Merriam-Webster.com Dictionary, Merriam-Webster, https://www.merriam-webster.com/dictionary/consist%20of. Accessed Mar. 27, 2020. (Year: 2020).*
International Search Report dated Aug. 10, 2016.
European Search Report dated Oct. 4, 2016.
Chinese Search Report dated Jul. 17, 2019.
Chinese Search Report dated Mar. 16, 2020.

* cited by examiner

HOUSING, METHOD OF MANUFACTURING THE SAME, AND ELECTRONIC DEVICE INCLUDING THE SAME

CLAIM OF PRIORITY

This application claims the priority under 35 U.S.C. § 119(a) to Korean Application Serial No. 10-2015-0056161, which was filed in the Korean Intellectual Property Office on Apr. 21, 2015, the entire content of which is hereby incorporated by reference.

TECHNICAL FIELD

Various embodiments of the present disclosure relate to a housing, and for example, relate to a housing for implementing multiple colors consisting of two or more colors, a method of manufacturing the housing, and an electronic device including the same.

BACKGROUND

The developments of electronic devices have been applied to various fields close to our lives. The electronic devices are circulated to have various sizes according to their functions and according to the tastes of the users, and the external appeal, functions, and slimness of the devices have become more important. Further, even though the device has substantially the same function as that of another manufacturer's device, the users prefer devices having an excellent and appealing design. In particular, the external appearance (color, texture, or the like) of a protection housing (for example, a protection cover) that is separately mounted to protect at least some areas of an electronic device is becoming a measure for improving a purchase demand of the user on the electronic device.

SUMMARY

A method is provided for manufacturing a housing, comprising: laminating a first layer and a second layer on a preform; and delaminating at least a portion of the second layer to form a delaminated area.

A method is provided for manufacturing a housing, comprising: laminating a first deposition layer on a preform; laminating an intermediate layer on the first deposition layer; laminating a second deposition layer on the intermediate layer; applying a color paint layer on the second deposition layer; delaminating at least some of the color paint layer and the second deposition layer to form at least one delaminated area; and forming a printing layer in the delaminated area, wherein the first deposition layer is visible through at least some areas of the printing layer.

A housing is provided comprising: a preform; a first deposition layer laminated on the preform; an intermediate layer laminated on the first deposition layer; a second deposition layer laminated on the intermediate layer; a color paint layer applied on the second deposition layer; and a printing layer formed in a delaminated area, after at least some of the color paint layer and the second deposition layer are delaminated to form the delaminated area, wherein the first deposition layer is visible through at least some areas of the printing layer.

BRIEF DESCRIPTION OF THE DRAWINGS

The above and other aspects, features, and advantages of the present disclosure will be more apparent from the following detailed description taken in conjunction with the accompanying drawings, in which.

DETAILED DESCRIPTION

Figure 1A:
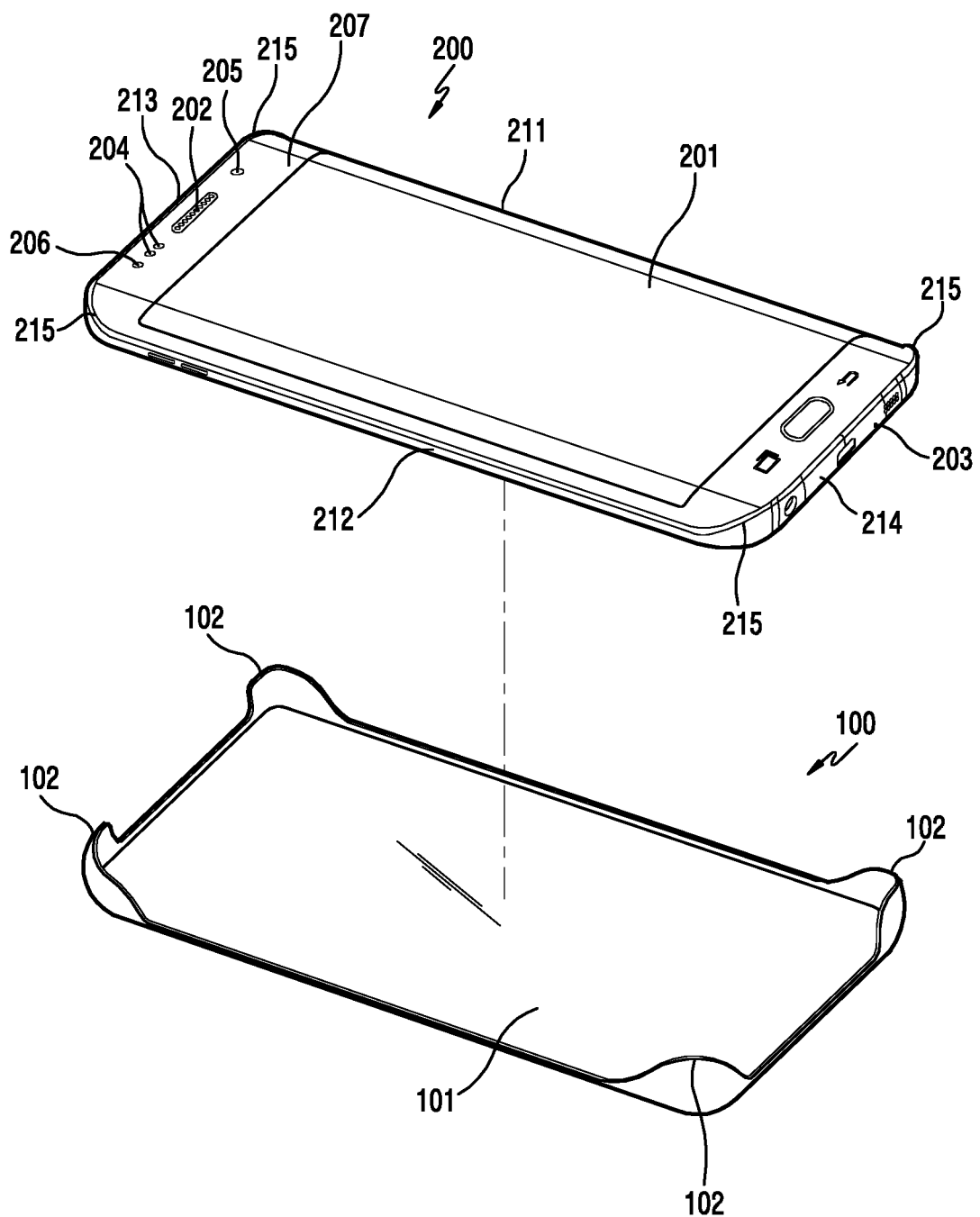
FIG. 1A is an exploded perspective view illustrating an example of an electronic device, according to various embodiments of the present disclosure.

Hereinafter, various embodiments of the present disclosure will be described with reference to the accompanying drawings. The present disclosure may be modified in various forms and include various embodiments, but specific examples are illustrated in the drawings and described in the description. However, the description is not intended to limit the present disclosure to the specific embodiments, and it shall be appreciated that all the changes, equivalents and substitutions belonging to the idea and technical scope of the present disclosure are included in the present disclosure. In the description of the drawings, identical or similar reference numerals are used to designate identical or similar elements.

The term "include" or "may include" refers to the existence of a corresponding disclosed function, operation or component which can be used in various embodiments of the present disclosure and does not limit one or more additional functions, operations, or components. In the present disclosure, the terms such as "include" or "have" may be construed to denote a certain characteristic, number, step, operation, constituent element, component or a combination thereof, but may not be construed to exclude the existence of or a possibility of addition of one or more other characteristics, numbers, steps, operations, constituent elements, components or combinations thereof.

The term "or" used in various embodiments of the present disclosure includes any or all of combinations of listed words. For example, the expression "A or B" may include A, may include B, or may include both A and B.

The expressions such as "first", "second", or the like used in various embodiments of the present disclosure may modify various component elements in the various embodiments but may not limit corresponding component elements. For example, the above expressions do not limit the sequence and/or importance of the elements. The expressions may be used to distinguish a component element from another component element. For example, a first user device and a second user device indicate different user devices although both of them are user devices. For example, a first element may be termed a second element, and similarly, a second element may be termed a first element without departing from the scope of the present disclosure.

When it is described that a certain structural element "is connected to" or "is in contact with" another structural element, it should be understood that although the certain structural element is directly connected to or is in direct contact with another structural element, still another structural element may be interposed therebetween. Conversely, when one component element is "directly coupled" or "directly connected" to another component element, it may be construed that a third component element does not exist between the first component element and the second component element.

The terms used to describe various embodiments of the present disclosure are used to describe a specific embodiment, and are not intended to limit the present disclosure. A singular expression may include a plural expression unless they are definitely different in a context.

Unless defined differently, all terms used herein, which include technical terminologies or scientific terminologies, have the same meaning as a person skilled in the art to which the present disclosure belongs. Such terms as those defined in a generally used dictionary are to be interpreted to have the meanings equal to the contextual meanings in the relevant field of art, and are not to be interpreted to have ideal or excessively formal meanings unless clearly defined in the present disclosure.

An electronic device according to various embodiments of the present disclosure may be a device with a communication function. For example, the electronic device may include at least one of a smart phone, a tablet Personal Computer (PC), a mobile phone, a video phone, an e-book reader, a desktop PC, a laptop PC, a netbook computer, a PDA, a Portable Multimedia Player (PMP), an MP3 player, a mobile medical device, a camera, a wearable device (for example, a Head-Mounted-Device (HMD) such as electronic glasses, electronic clothes, an electronic bracelet, an electronic necklace, an electronic appcessory, an electronic tattoo, and a smart watch).

According to some embodiments, the electronic device may be a smart home appliance with a communication function. The smart home appliances may include at least one of, for example, televisions, digital video disk (DVD) players, audio players, refrigerators, air conditioners, cleaners, ovens, microwaves, washing machines, air purifiers, set-top boxes, TV boxes (e.g., HomeSync™ of Samsung, Apple TV™, or Google TV™), game consoles, electronic dictionaries, electronic keys, camcorders, or electronic frames.

According to some embodiments, the electronic device may include at least one of various medical devices such as a magnetic resonance angiography (MRA) scanner, a magnetic resonance imaging (MRI) scanner, a computed tomography (CT) scanner, a scanner, an ultrasonograph, or the like, a navigation device, a Global Positioning System (GPS) receiver, an Event Data Recorder (EDR), a Flight Data Recorder (FDR), a vehicle infotainment device, an electronic equipment for ship (for example a ship navigation device and gyro-compass and the like, avionics, a security device, a head unit for vehicle, an industrial or household robot, ATM (automatic teller machine) in banking facilities or POS (point of sales) in stores.

According to some embodiments, the electronic device may include at least one of furniture or a part of a building/structure, an electronic board, an electronic signature receiving device, a projector, and various types of measuring devices (for example, a water meter, an electric meter, a gas meter, a radio wave meter and the like) including a camera function. An electronic device according to various embodiments of the present disclosure may be a combination of one or more of above-described various devices. Also, an electronic device according to various embodiments of the present disclosure may be a flexible device. Also, an electronic device according to various embodiments of the present disclosure is not limited to the above-described devices.

Hereinafter, an electronic device according to various embodiments will be described with reference to the accompanying drawings. The term "user" used in various embodiments may refer to a person who uses an electronic device or a device (for example, an artificial intelligence electronic device) that uses an electronic device.

Figure 1B:
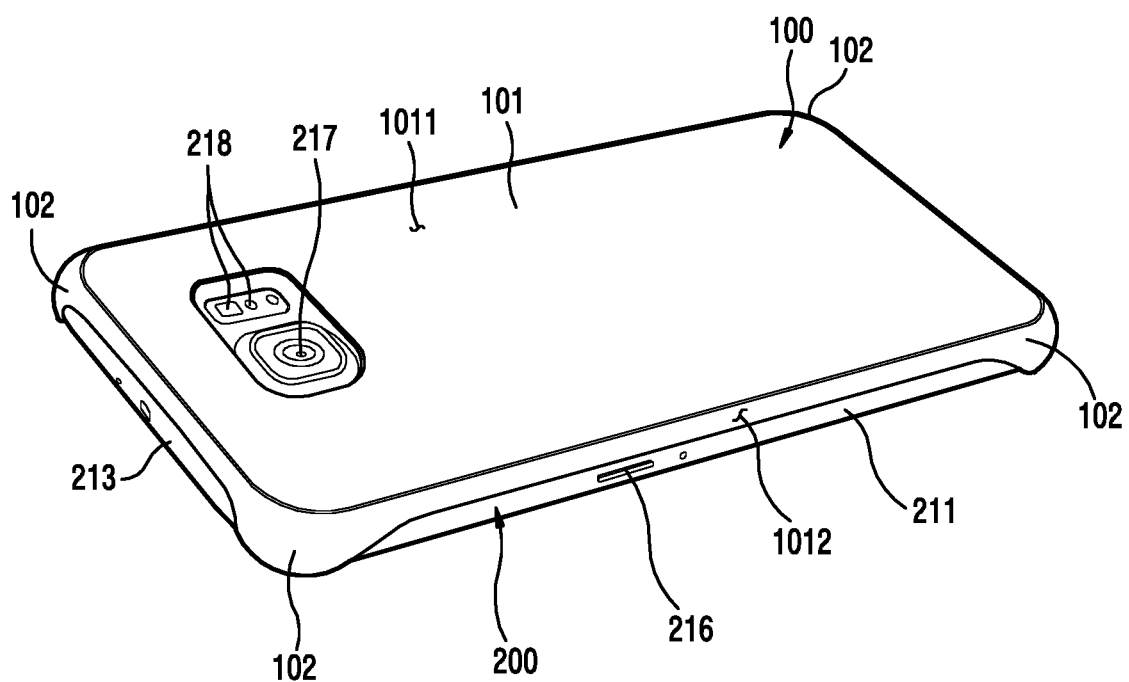
FIG. 1B is a perspective view of the electronic device of FIG. 1A, according to various embodiments of the present disclosure.

FIG. 1A is an exploded perspective view illustrating an example in which an electronic device 200 and a housing 100 according to various embodiments of the present disclosure. FIG. 1B is a perspective view illustrating an example in which the electronic device 200 is mounted on the housing 100, according to various embodiments of the present disclosure.

Referring to FIGS. 1A and 1B, a display 201 may be installed on a front surface 207 of the electronic device 200. A speaker unit 202 for receiving the voice of a counterpart may be installed above the display 201. A microphone unit 203 for transmitting the voice of the user of the electronic device to a counterpart may be installed below the display 201.

According to an embodiment of the present disclosure, components for performing various functions of the electronic device 200 may be arranged near the speaker unit 202. The components may include at least one sensor module 204. The sensor module 204 may include, for example, at least one of an illumination intensity sensor (for example, a light sensor), a proximity sensor, an infrared ray sensor, and an ultrasonic wave sensor. According to an embodiment of the present disclosure, the components may include a camera unit 205. According to one embodiment of the present disclosure, the components may include an LED indicator 206 to provide the user with information on the state information of the electronic device 200. According to various embodiments of the present disclosure, the electronic device 200 may have a right periphery 211, a left periphery 212, an upper periphery 213, and a lower periphery 214 when viewed from the front side. According to an embodiment of the present disclosure, the peripheries 211, 212, 213, and 214 may function as side surfaces of the electronic device 200.

According to various embodiments of the present disclosure, the electronic device 200 may further include a protection housing 100 for accommodating at least an area. According to an embodiment of the present disclosure, the protection housing 100 may be implemented to protect at least an area of the rear surface and the peripheries of the electronic device 200. According to an embodiment of the present disclosure, the protection housing 100 may include a plate type device accommodating part 101 for accommodating the rear surface of the electronic device 200, and stop ribs 102 extending from the four corners of the device accommodating part 101 upwards. According to an embodiment of the present disclosure, the stop ribs 102 may tightly accommodate the four corners 215 of the electronic device 200 such that the electronic device 200 is not separated from the protection housing 100 unless a predetermined external pressure is applied to the electronic device 200. However, the present disclosure is not limited thereto, but the protection housing 100 may support various portions of the electronic device 200 according to the shape of the electronic device 200.

Referring to FIG. 1B, the protection housing 100 may expose a camera unit 217 and a sensor module (including a flash) 218 that is arranged on the rear surface of the electronic device 200 that is exposed to the outside, and the remaining area of the rear surface of the electronic device 200 may be arranged to be hidden. According to an embodiment of the present disclosure, the protection housing 100 may be installed to support only the four corners of the electronic device 200, and may allow the electronic components (for example, a key button 216) that are exposed to the outside of the electronic device 200 to be easily manipulated.

According to various embodiments of the present disclosure, the protection housing 100 may have a multiple color area having two colors. According to an embodiment of the present disclosure, the protection housing 100 may have a first color area 1011 formed in almost all portions of the device accommodating part 101, and a second color area 1012 formed to the peripheries of the first color area 1011 and the stop ribs 102 extending along the peripheries. According to an embodiment of the present disclosure, the first color area 1011 and the second color area 1012 may be implemented by deposition colors including deposition layers. However, the present disclosure is not limited thereto, but at least two general colors may be implemented at the same time.

According to various embodiments of the present disclosure, a printing layer may be further formed while taking the first color area 1011 as the base thereof. In this case, the first color area 1011 may be configured such that the deposition color is at least partially exposed through the printing layer as the base so that a metallic color printing layer is implemented. Accordingly, because both the first color area 1011 having the printing layer and the second color area 1012 formed to the stop ribs 102 along the peripheries of the first color area 1011 are implemented by deposition colors, the protection housing 100 may have a more appealing external appearance and the user may be provided with an improved aesthetic appeal.

Figure 1C:
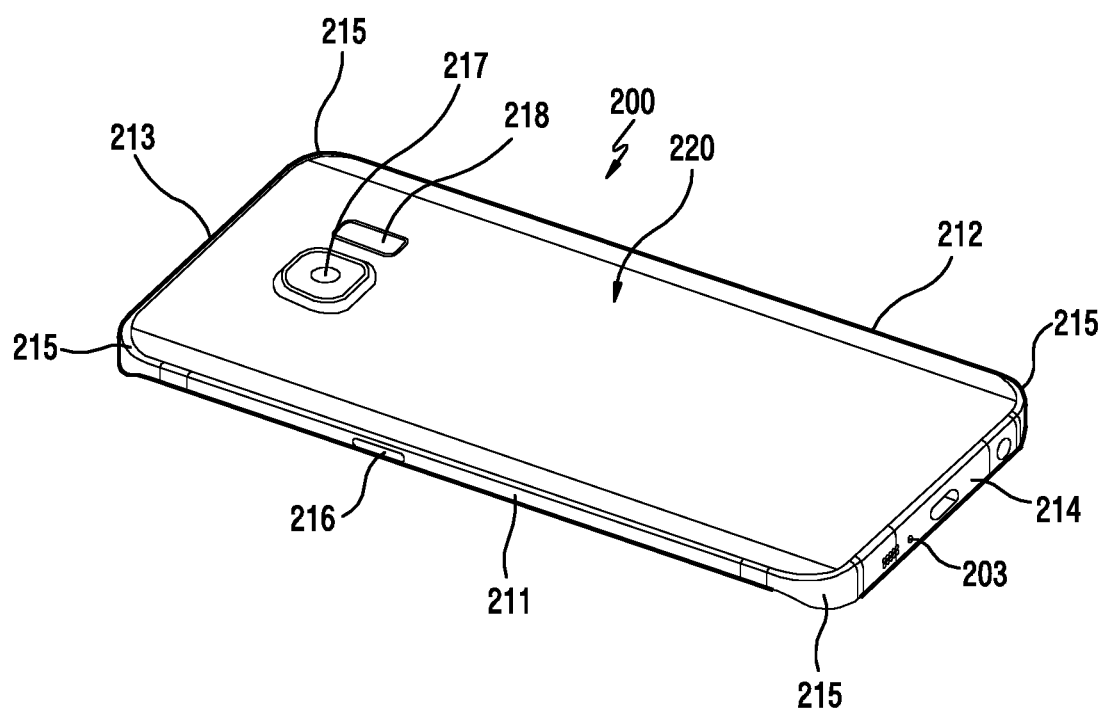
FIG. 1C is a rear perspective view of the electronic device of FIG. 1A, according to various embodiments of the present disclosure.

FIG. 1C is a rear perspective view of the electronic device 200, according to various embodiments of the present disclosure.

Referring to FIG. 1C, a cover member 220 may be installed on the rear surface of the electronic device 200. According to an embodiment of the present disclosure, the cover member 220 may be a battery cover for protecting a battery pack that is detachably installed in the electronic device 200 and for making the external appearance of the electronic device 200 appealing. However, the present disclosure is not limited thereto, but the cover member 220 may be integrally formed with the electronic device 200 to directly contribute as a rear housing of the electronic device 200. According to an embodiment of the present disclosure, a camera unit 217 and a flash 218 may be arranged on the rear surface of the electronic device 200.

According to various embodiments of the present disclosure, the two or more multiple color areas may be implemented in the cover member 220. According to an embodiment of the present disclosure, one or more color areas of the multiple color area may have a deposition color. According to an embodiment of the present disclosure, one or more color areas of the multiple color area may include a printing area, and the printing area may use a deposition color as the base thereof. According to an embodiment of the present disclosure, the printing area may be used for various printouts, such as a logo of the manufacturer of the electronic device and an indicator for electronic components.

According to various embodiments of the present disclosure, the protection housing 100 and the cover member 220, which have been mentioned above, may be formed by using at least one of metal, glass, a composite material, and a synthetic resin.

Figure 2A:
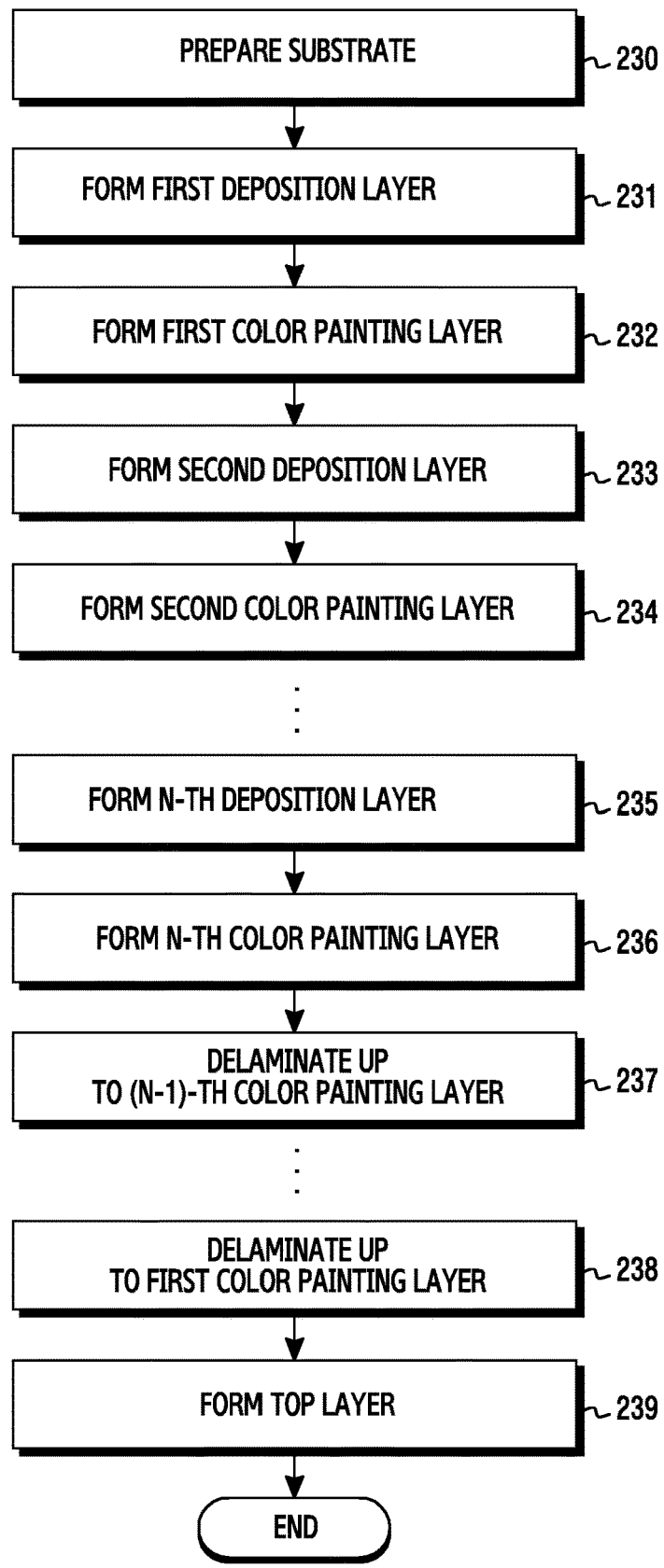
FIG. 2A is a flowchart of an example of a process for manufacturing a housing, according to various embodiments of the present disclosure.
Figure 2B:
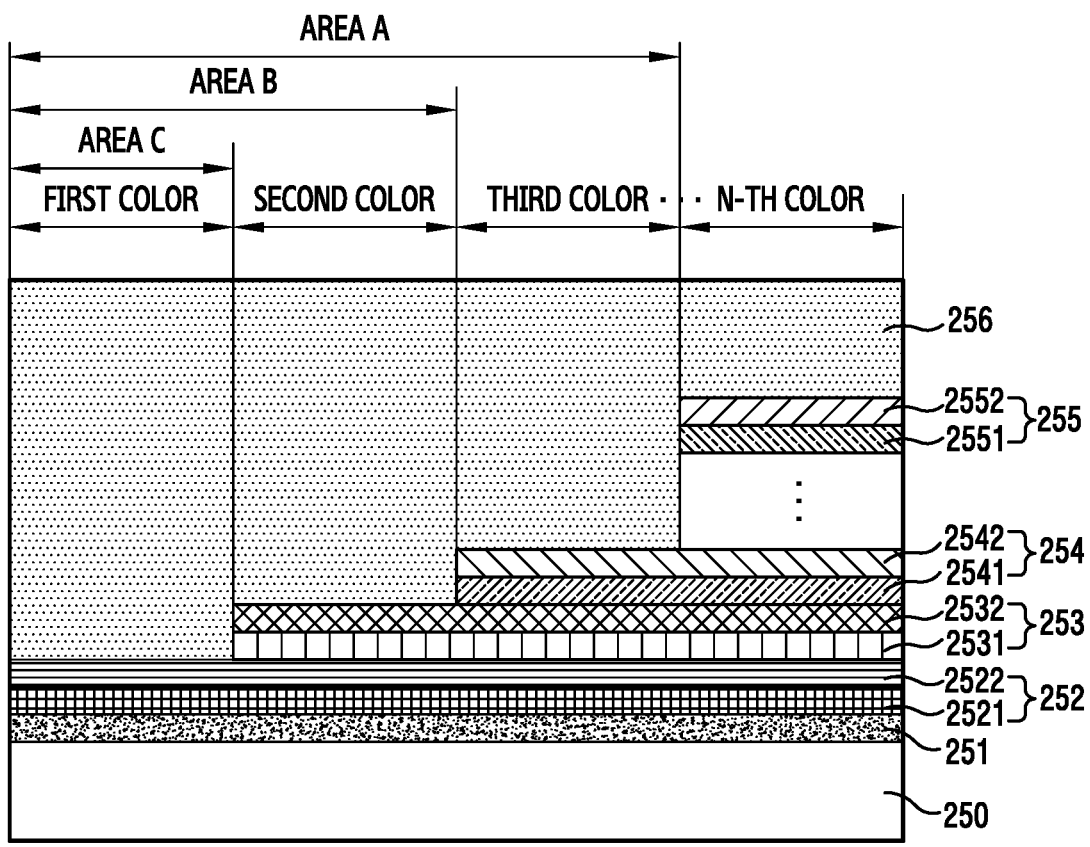
FIG. 2B is a diagram of an example of a housing cross-section, according to various embodiments of the present disclosure.

FIG. 2A is a flowchart of an example of a process for manufacturing a housing having a multiple color area, according to various embodiments of the present disclosure. FIG. 2B is a sectional view illustrating a main part of the housing formed according to the manufacturing method of FIG. 2A according to various embodiments of the present disclosure.

According to an embodiment of the present disclosure, the housing may include a protection cover arranged to protect at least a portion of an electronic device. According to an embodiment of the present disclosure, the housing may include at least one of a case frame that defines an external appearance of an electronic device, and a battery cover that is installable on the case frame.

In a description of the manufacturing process of FIG. 2A, the configuration of FIG. 2B will be referenced.

Referring to FIGS. 2A and 2B, in operation 230, a preform 250 having a predetermined shape may be manufactured as illustrated in FIG. 2B. According to an embodiment of the present disclosure, the preform 250 may be formed of at least one of a synthetic resin, glass, metal, and a composite material. According to an embodiment of the present disclosure, when the preform 250 is formed of metal, it may be formed through casting, pressing, or the like. According to an embodiment of the present disclosure, when the preform 250 is formed of a synthetic resin, it may be formed through injection molding. According to an embodiment of the present disclosure, when the preform 250 is formed of dissimilar materials of a synthetic resin and metal, it may be formed through dual injection molding.

Thereafter, a first deposition layer 2521 may be formed on one surface of the preform 250 in operation 231, and a first color paint layer 2522 may be formed on the first deposition layer 2521 in operation 232. According to an embodiment of the present disclosure, the first deposition layer 2521 and the first color paint layer 2522 may be formed as a first deposition color layer 252. For example, the first deposition color layer 252 may be implemented such that the first color paint layer 2522 has a metallic color while taking the first deposition layer 2521 as the base thereof.

According to various embodiments of the present disclosure, a bottom layer 251 may be further laminated between the preform 250 and the first deposition layer 2521. According to an embodiment of the present disclosure, the bottom layer 251 may be formed of several layers of materials, and a film may be formed by painting in a UV or urethane curing manner according to a resin of acryl, olefin, urethane, or the like and its curing manner. The bottom layer 251 is adapted to uniformly and smoothly apply and stick a deposition material to the surface of the housing. According to an embodiment of the present disclosure, the preform 250, to which the bottom layer 251 is applied, may be cured by using an oven or via natural drying, or may be cured via an ultraviolet ray curing method.

According to various embodiments of the present disclosure, the first deposition layer 2521 may be laminated on the bottom layer 251 after the bottom layer 251 is cured. According to an embodiment of the present disclosure, the deposition method may include Physical Vapor Deposition (PVD) and Chemical Vapor Deposition (CVD). According to an embodiment of the present disclosure, the first deposition layer 2521 may be formed of at least one of Ti-based, Sn-based, Cr-based, and Al-based materials. According to an embodiment of the present disclosure, the first deposition layer 2521 may include at least one of $TiO_2$, TiN, TiCN, and $SiO_2$. According to an embodiment of the present disclosure, the first deposition layer 2521 may be formed by depositing at least one of a silicon oxide ($SiO_2$) film, a titanium oxide ($TiO_2$) film, an aluminum oxide ($Al_2O_3$) film, a zirconium oxide film ($ZrO_2$), and tantalum oxide ($Ta_2O_5$) film.

Thereafter, in operation 233, a second deposition layer 2531 may be formed on the first color paint layer 2522, and a second color paint layer 2532 may be laminated on the second deposition layer 2531. According to an embodiment of the present disclosure, the second deposition layer 2531 and the second color paint layer 2532 may be formed as a second deposition color layer 253. For example, the second deposition color layer 253 may be implemented such that the second color paint layer 2532 has a metallic color while taking the second deposition layer 2531 as the base thereof. According to an embodiment of the present disclosure, the second deposition layer 2532 may also be formed of at least one of the above-mentioned materials of the first deposition layer 2521. Through this method, a third deposition color layer 254, including a third deposition layer 2541 and a third color paint layer 2542 laminated on the third deposition layer 2541, may be formed.

According to various embodiments of the present disclosure, as mentioned above, a plurality of first to N-th deposition color layers 255 may be sequentially laminated in a manner in which the second deposition color layer 253 is laminated on the first deposition color layer 252 and the third deposition color layer 254 is laminated on the second deposition color layer 253. Accordingly, the N-th deposition color layer 255 may be formed by performing operation 235 of laminating an N-th deposition layer 2551 on an (N−1)-th color paint layer, and operation 236 of laminating an N-th color paint layer 2552 on the N-th deposition layer 2551.

Thereafter, an operation of delaminating a plurality of laminated deposition color layers 252, 253, 254, and 255 having different colors in different areas may be performed. According to an embodiment of the present disclosure, the delamination operation may be performed by using laser etching. According to an embodiment of the present disclosure, the delamination operation may be performed by using various types of lasers, such as fiber (diodes) lasers, YAG lasers, gas lasers, and ultraviolet ray lasers, according to the properties of the delaminated layers. According to an embodiment of the present disclosure, in operation 237, a predetermined area to the (N−1)-th color paint layer may be delaminated while the N-th color paint layer 2552 is finally formed. According to an embodiment of the present disclosure, operation 238 of sequentially delaminating up to the first color paint layer 2521 in different areas may be performed in this method.

According to various embodiments of the present disclosure, FIG. 2B illustrates a sectional view of a housing having different areas in which the deposition color layers 252, 253, and 254 are sequentially delaminated.

As illustrated, while up to the N-th color paint layer 2552 is laminated, the third color paint layer 2542 may be delaminated to be exposed by area A. According to an embodiment of the present disclosure, the second color paint layer 2532 may be delaminated to be exposed by area B in area A. According to an embodiment of the present disclosure, the first color paint layer 2522 may be delaminated to be exposed by area C in area B. Accordingly, when the housing is viewed as a whole, the first deposition color layer 252 may be viewed in area C, the second deposition color layer 253 may be viewed in area B-C, the third deposition color layer 254 may be viewed in area A-B, and the N-th deposition color layer 255 may be viewed in the remaining areas. That is, deposition color layers 252, 253, 254, and 255 of different colors may be viewed in a desired area by adjusting a delamination area in one housing. However, the present disclosure is not limited thereto, and a general color layer obtained by excluding a deposition layer from at least one deposition color layer may be applied.

Thereafter, in operation 239, after the areas are delaminated, a top layer 256 may be laminated on the delaminated areas. According to an embodiment of the present disclosure, the top layer 256 may be used by ejecting urethane paint of a transparent material. According to an embodiment of the present disclosure, the top layer 256 may be formed of various UV curing material in the form of a fingerprint resistance additive.

According to various embodiments of the present disclosure, the color layer may be formed of a material that may form a paint layer in all ranges in which curing reactions of, for example, UV, urethane, curing type, an SF paint, and a water paint, according to materials and environments. According to an embodiment of the present disclosure, a fluidic paint formed of a resin, a solvent, a pigment/dye, and an additive may form a color paint layer. According to an embodiment of the present disclosure, the color paint layer may be formed of a single layer or multiple layers according to materials or products. According to an embodiment of the present disclosure, the color of the color paint layer may include a paint including an organic/inorganic pigment, an organic dye, silver, and pearl.

According to various embodiments of the present disclosure, the deposition layers formed in the deposition color layers 252, 253, 254, and 255 may have a plurality of layers. According to an embodiment of the present disclosure, the deposition layers having a plurality of layers may be formed of different materials. According to an embodiment of the present disclosure, the deposition film may be obtained by alternately depositing two or more deposition materials. According to an embodiment of the present disclosure, the deposition film may be formed by alternately depositing a first deposition material that achieves a first desired refractivity by mixing two or more deposition materials, and a second deposition material that achieves a second desired refractivity that is different from the first refractivity. For example, the refractivity of the silicon oxide (SiO2) film is 1.4, the refractivity of the titanium oxide (TiO2) film is 2.4, and the refractivity of the aluminum oxide (Al2O3) film is 1.7. Accordingly, if the silicon oxide (SiO2) film and the titanium oxide (TiO2) film, the refractivity difference of which is large, are alternately deposited, it is very advantageous to achieve a ceramic pearl texture effect and an anisotropic color reproduction effect.

Figure 3A:
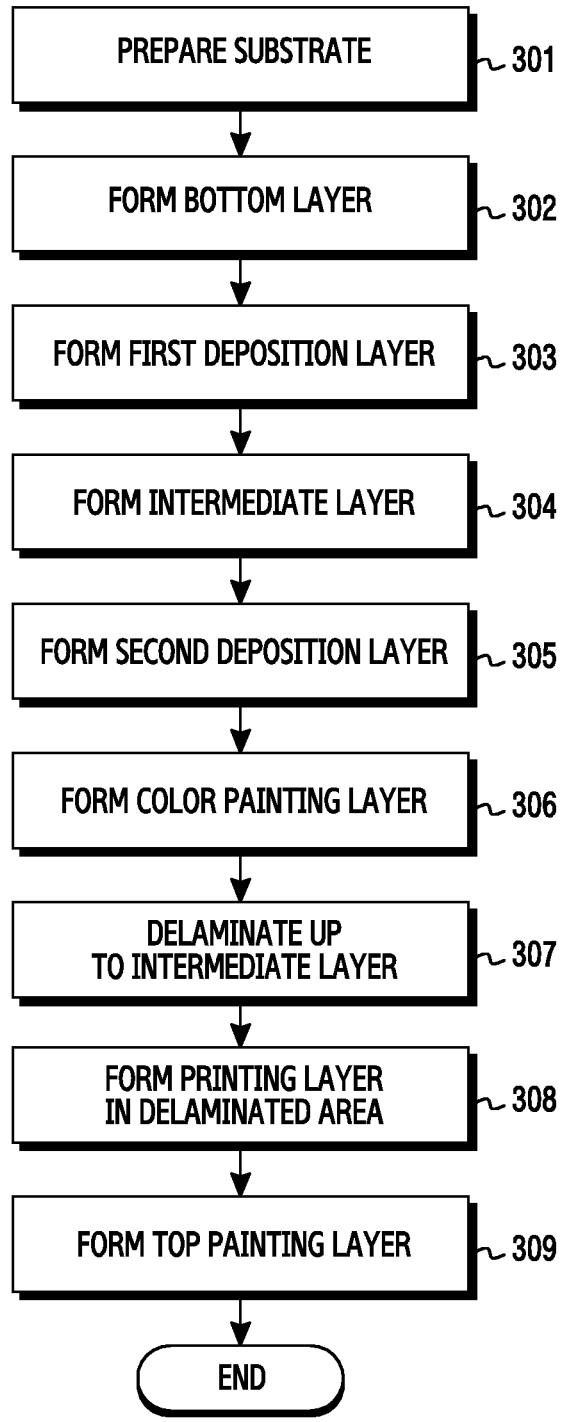
FIG. 3A is a diagram of an example of a process for manufacturing a housing, according to various embodiments of the present disclosure.

FIG. 3A is a flowchart of an example of a process for manufacturing a housing 300 having a printing area, according to various embodiments of the present disclosure. FIGS. 3B-E are schematic diagrams illustrating a cross-section of the housing of FIG. 3A during different stages of its manufacturing, according to various embodiments of the present disclosure. FIG. 3F is a diagram of an example of the housing of FIG. 3A, according to various embodiments of the present disclosure. FIG. 3G is an image of a housing formed according to the manufacturing method of FIG. 3A, according to various embodiments of the present disclosure.

In a description of the manufacturing process of FIG. 3A, the configurations of FIGS. 3B to 3G will be referenced.

Figure 3B:
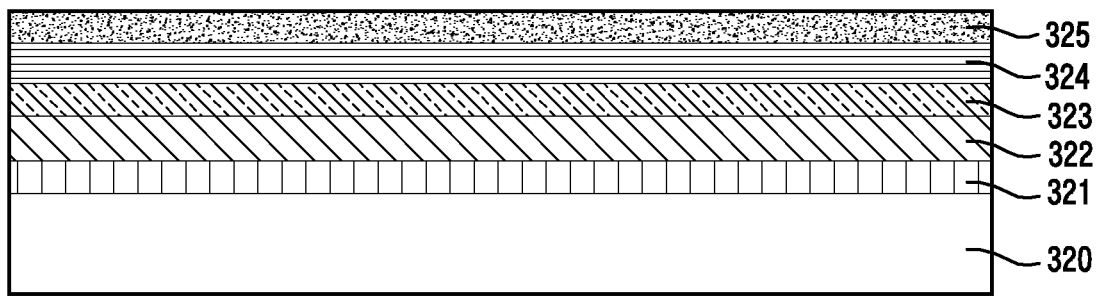
FIG. 3B is a diagram illustrating a cross-section of the housing of FIG. 3A during a given stage of its manufacturing, according to various embodiments of the present disclosure.
Figure 3C:
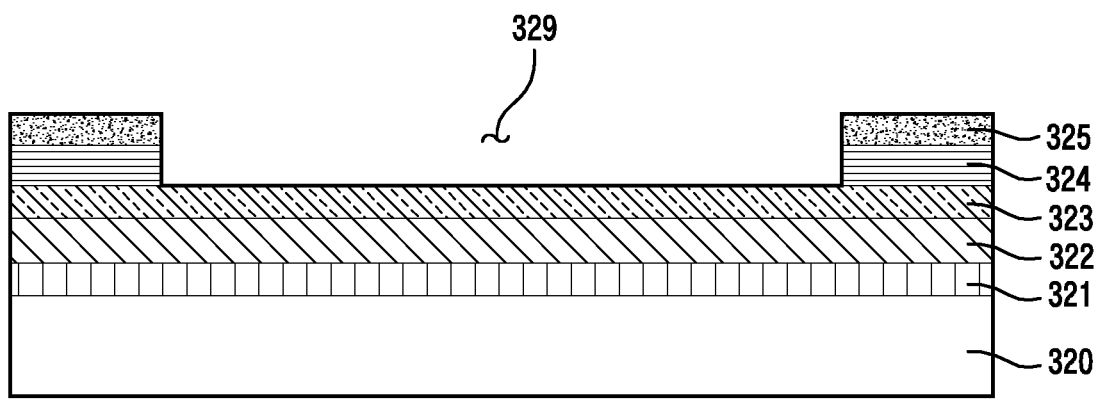
FIG. 3C is a diagram illustrating a cross-section of the housing of FIG. 3A during a given stage of its manufacturing, according to various embodiments of the present disclosure.
Figure 3D:
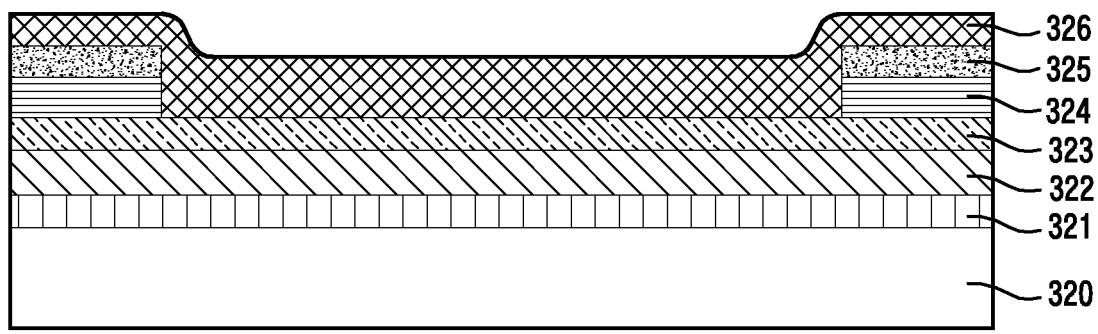
FIG. 3D is a diagram illustrating a cross-section of the housing of FIG. 3A during a given stage of its manufacturing, according to various embodiments of the present disclosure.
Figure 3E:
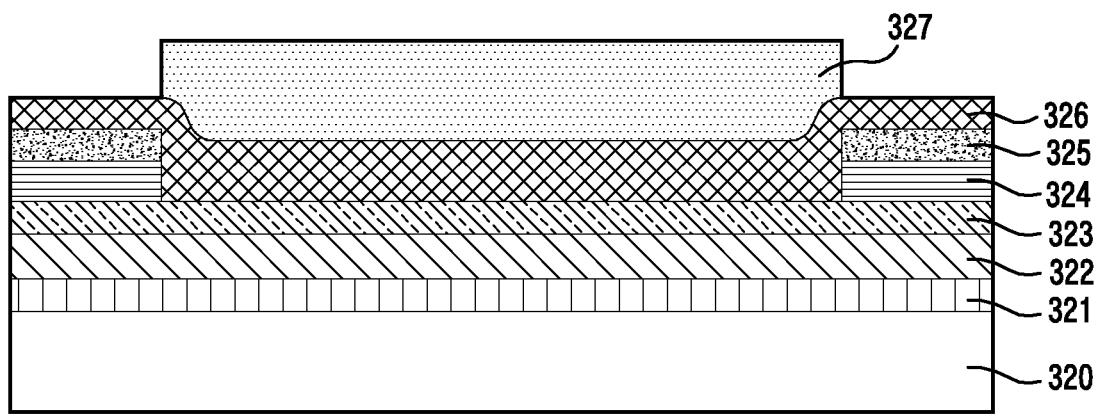
FIG. 3E is a diagram illustrating a cross-section of the housing of FIG. 3A during a given stage of its manufacturing, according to various embodiments of the present disclosure.
Figure 3F:
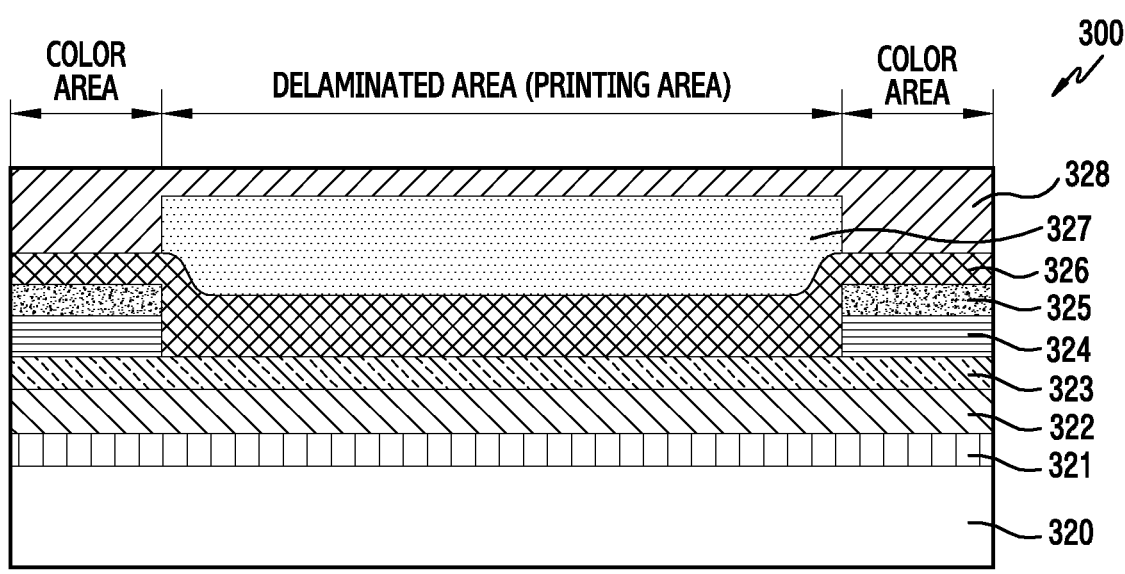
FIG. 3F is a diagram of an example of the housing of FIG. 3A, according to various embodiments of the present disclosure.
Figure 3G:
FIG. 3G is an image of an example of a housing, according to various embodiments of the present disclosure.

Referring to FIGS. 3A-3G in operation 301, a preform 320 having a predetermined shape may be manufactured as illustrated in FIG. 3B. According to an embodiment of the present disclosure, the preform 320 may be formed of at least one of a synthetic resin, glass, metal, and a composite material.

Thereafter, in operation 302, a bottom layer 321 may be laminated on one surface of the preform 320. According to an embodiment of the present disclosure, the bottom layer 321 may be formed of a material that may easily deposit a deposition material and smoothly attach a deposition film in the deposition operation, which will be described below. According to an embodiment of the present disclosure, the bottom layer 321 may be formed of several layers of materials, and a film may be formed by painting a paint in a UV or urethane curing manner according to a resin of acryl, olefin, urethane, or the like and its curing manner. However, the present disclosure is not limited thereto, and the bottom layer 321 may be formed by a transparent urethane paint. The bottom layer 321 functions to uniformly and smoothly apply and stick a deposition material to the surface of the housing. According to an embodiment of the present disclosure, the preform 320, to which the bottom layer 321 is applied, may be cured by using an oven or natural drying, or an ultraviolet ray curing method.

Thereafter, in operation 303, after the bottom layer 321 is cured, the first deposition layer 322 may be laminated on the bottom layer 321. According to an embodiment of the present disclosure, the deposition method may include Physical Vapor Deposition (PVD) and Chemical Vapor Deposition (CVD). According to an embodiment of the present disclosure, the first deposition layer 322 may be formed of at least one of Sn-based, Ti-based, Cr-based, and Al-based materials. According to an embodiment of the present disclosure, the first deposition layer 322 may include at least one of TiO2, TiN, TiCN, and SiO2. According to an embodiment of the present disclosure, the first deposition layer 322 may be formed by depositing at least one of a silicon oxide (SiO2) film, a titanium oxide (TiO2) film, an aluminum oxide (Al2O3) film, a zirconium oxide film (ZrO2), and tantalum oxide (Ta2O5) film.

Thereafter, in operation 304, an intermediate layer 323 may be formed on the first deposition layer 322. According to an embodiment of the present disclosure, the intermediate layer 323 may allow the second deposition layer 324 that is laminated on the intermediate layer 323 to be easily formed, and may be formed of a material having an excellent deposition film attachment property. According to an embodiment of the present disclosure, the intermediate layer 232 may be formed of at least one of Chlorinated Polyolefin (CPO) based resin (for example, CPO_Cl type primer), an acryl modified resin, and a UV curing resin. The intermediate layer 323 may prevent the first deposition layer 322 from being damaged in a delamination operation, which will be described below. According to an embodiment of the present disclosure, the uppermost layer in the painting steps may be formed of a UV paint of oligomer, monomer, and a light initiator.

Thereafter, in operation 305, a second deposition layer 324 may be formed on the intermediate layer 323, and a color paint layer 325 may be formed on the second deposition layer 324 through operation 306. According to an embodiment of the present disclosure, the color paint layer 325 may use a color that is applied to an area, to which a printing layer 327 that will be described below is not applied (that is, to an area except for the printing area of the housing 300). According to an embodiment of the present disclosure, the color paint layer 325 may be implemented as a metallic deposition color layer while taking the second deposition layer 324 as the base thereof.

According to various embodiments of the present disclosure, the color paint layer 325 may be formed of a material that may form a paint layer in all ranges in which curing reactions of, for example, UV, urethane, curing type, an SF paint, and a water paint, according to materials and environments. According to an embodiment of the present disclosure, a fluidic paint formed of a resin, a solvent, a pigment/dye, and an additive may form a color paint layer. According to an embodiment of the present disclosure, the color paint layer 325 may be formed of a single layer or multiple layers according to materials or products. According to an embodiment of the present disclosure, the color of the color paint layer 325 may include a paint including an organic/inorganic pigment, an organic dye, silver, and pearl.

Thereafter, in operation 307, an operation of delaminating up to the intermediate layer 323 in a predetermined area of the preform 320 may be performed. According to an embodiment of the present disclosure, the delamination operation may be performed by using laser etching. According to an embodiment of the present disclosure, the delamination may be performed by using various types of lasers, such as fiber (diodes) lasers, YAG lasers, gas lasers, and ultraviolet ray lasers, according to the properties of the delaminated layers.

According to various embodiments of the present disclosure, referring to FIG. 3C, a delamination area 329 is an area in which a printing layer 327 will be formed, and may be a printing area of FIG. 3G, or may be an area 1011 of FIG. 1B. According to an embodiment of the present disclosure, the first deposition layer 322, the second deposition layer 324 and the color paint layer 325 may have different colors. According to an embodiment of the present disclosure, when the first deposition layer 322 of the printing area formed through the delamination operation has a silver color, the color paint layer 325 may have various different colors. For example, the second deposition color layer 325 may include any one of various colors of green, red, and gold.

Thereafter, in operation 308, the printing layer 327 may be formed in the delamination area 329. According to an embodiment of the present disclosure, the printing layer 327 may be formed by using various methods such as Direct Digital Printing (DDP), gravure printing, thermal transfer printing, water transfer printing, pad printing, and silk printing. According to an embodiment of the present disclosure, as illustrated in FIGS. 3D and 3E, before the printing layer 327 is laminated, a primer layer 326 (for example, a DDP primer layer), including the delaminated area and the color paint layer 325, may be further laminated on the printing layer 327. According to an embodiment of the present disclosure, the primer layer 326 may be formed of a material having an excellent attachment property (for example, a CPO based resin).

Thereafter, in operation 309, a method of laminating the top layer 328 on the printing layer 327 may be performed. According to an embodiment of the present disclosure, the top layer 328 may be formed by applying a transparent urethane paint in an ejection manner to protect the printing layer 327. According to an embodiment of the present disclosure, the colors of the printing layer 327 and the color paint layer 325 may be naturally expressed by applying a Soft Feel (SF) paint on the top layer 328. According to an embodiment of the present disclosure, the top layer 328 may be painted by applying transparency or coloring to protect the printing layer 327 and the product, and may express a texture by applying a paint of an UV, urethane, or a curing paint, or by applying an SF paint according to a curing manner.

According to various embodiments of the present disclosure, as illustrated in FIG. 3F, in the housing 300 that is finished through the above-mentioned processes, because the delamination area (that is, the printing area) achieves the first deposition layer 322 while taking the printing layer 327 as the base, a metallic printing layer may be acquired, and the color paint layer 325 may also be implemented as a deposition color layer by the second deposition layer 324. That is, a product having an improved aesthetic appeal may be provided for the user by implementing 2 tones in a deposition color layer.

Figure 4:
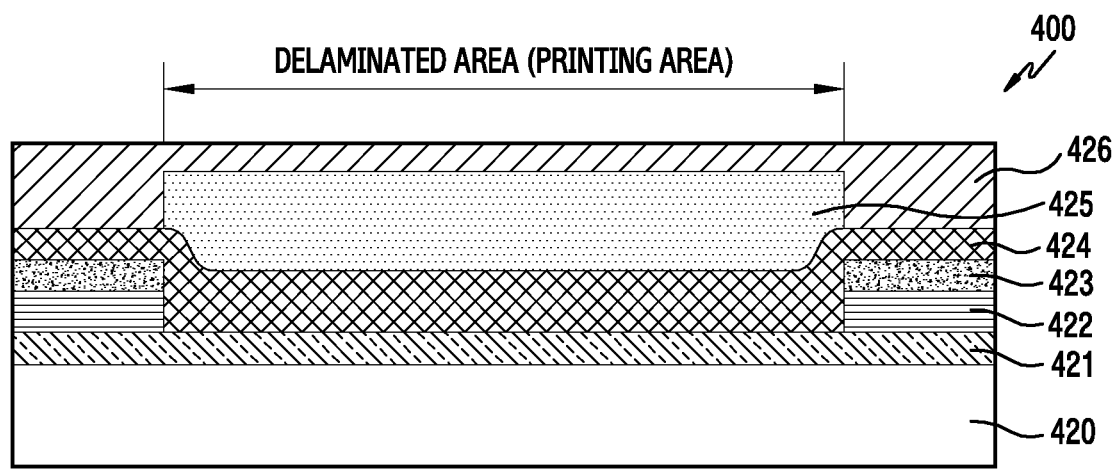
FIG. 4 is a diagram of an example of a housing cross-section, according to various embodiments of the present disclosure.
Figure 5:
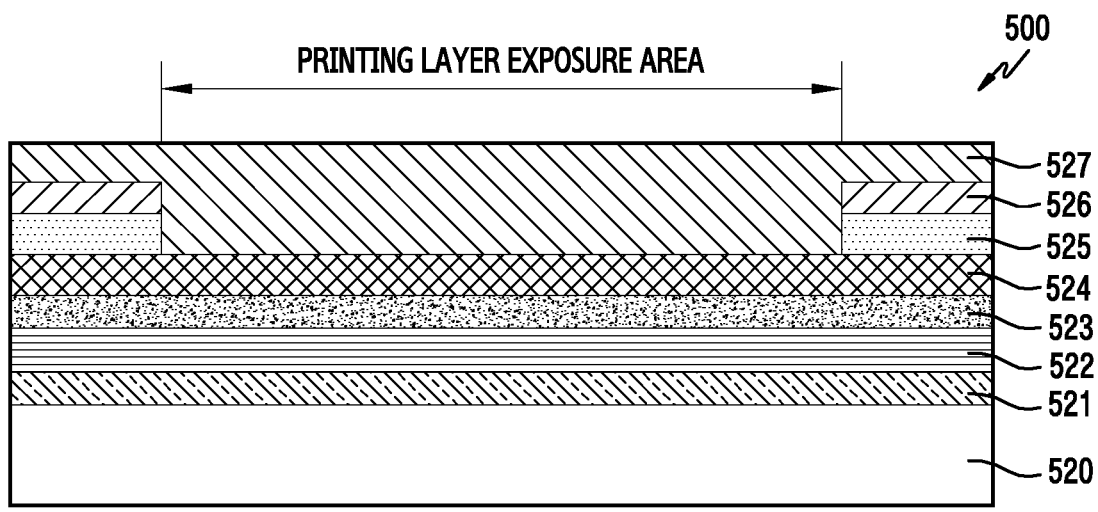
FIG. 5 is a diagram of an example of a housing cross-section, according to various embodiments of the present disclosure.

FIGS. 4-5 are diagrams illustrating an example of a cross-section of a housing having a printing area, according to various embodiments of the present disclosure.

Referring to FIG. 4, according to various embodiments of the present disclosure, the housing 400 may have a structure in which after a first color paint layer 421, a deposition layer 422, and a second color paint layer 423 are sequentially laminated on a preform 420, a printing area is delaminated, and after a primer layer 424 is laminated on the delaminated printing area, a printing layer 425 is formed and a top layer 426 is laminated. According to an embodiment of the present disclosure, because the first color paint layer 421, the deposition layer 422, the second color paint layer 423, the primer layer 424, the printing layer 425, and the top layer 426 may be formed through the above-mentioned processes and of the above-mentioned materials, a detailed description thereof will be omitted.

According to various embodiments of the present disclosure, the first deposition layer 322 laminated as the base of the printing layer 327 of FIG. 3F may be replaced by the first color paint layer 421. According to an embodiment of the present disclosure, the first color paint layer 421 may be formed with silver color paint in order to give the housing a metallic look while taking the printing layer 425 as the base thereof. According to an embodiment of the present disclosure, in the silver color paint, a separate intermediate layer may be excluded and up to the first color paint layer 421 may be delaminated during the delamination operation.

Referring to FIG. 5, the printing layer 524 of the housing 500 may be laminated first on the bottom of the deposition color layer formed by the second deposition layer 525 and the color paint layer 526. According to an embodiment of the present disclosure, in the housing 500, after the bottom layer 521, the first deposition layer 522, the primer layer 523, the printing layer 524, the second deposition layer 525, and the color paint layer 526 are sequentially laminated on the preform 520, the top layer 527 may be laminated on a predetermined delaminated area after the predetermined area is delaminated as a printing layer exposure area. However, the present disclosure is not limited thereto, but the second deposition layer 525 and the color paint layer 526 may be formed while the delaminated area is masked in the embodiment of the present disclosure. According to an embodiment of the present disclosure, because the bottom layer 521, the first deposition layer 522, the primer layer 523, the printing layer 524, the second deposition layer 525, the color paint layer 526, and the top layer 527 may be formed through the above-mentioned processes and of the above-mentioned materials, a detailed description thereof will be omitted.

According to various embodiments of the present disclosure, because the first deposition layer 522 is provided while taking the printing layer as the base thereof through the printing layer exposure area in the housing 500, a metallic color may be provided for the printing layer 524 and a metallic color may also be provided for the color paint layer 526 by the second deposition layer 525.

Figure 6:
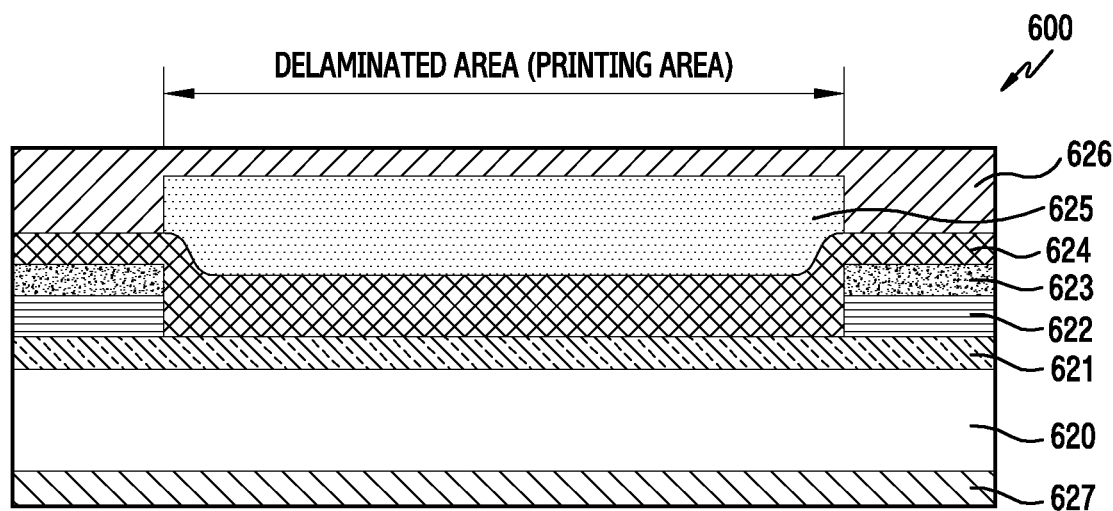
FIG. 6 is a diagram of an example of a housing cross-section, according to various embodiments of the present disclosure.
Figure 7:
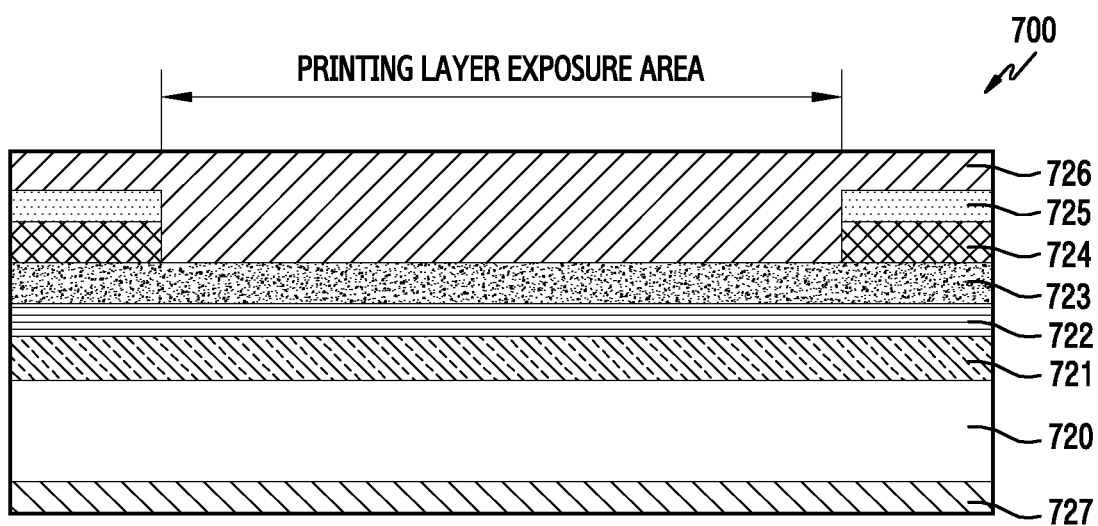
FIG. 7 is a diagram of an example of a housing cross-section, according to various embodiments of the present disclosure.

FIGS. 6 and 7 are diagrams illustrating an example of a cross-section of a housing having a printing area, according to various embodiments of the present disclosure.

According to various embodiments of the present disclosure, the metallic first deposition layer provided as the base of the printing layer or the metallic color paint layer may be laminated on a surface of the preform that is opposite to the surface on which the second deposition layer is laminated. In this case, the preform may be formed of a transparent, or at least semi-transparent, material. According to an embodiment of the present disclosure, while the second deposition layer may be laminated on the upper surface of the preform, the first deposition layer may be laminated on the bottom surface of the preform.

Referring to FIG. 6, after the bottom layer 621, the second deposition layer 622, and the color paint layer 623 are sequentially laminated on one surface of the preform 620 of the housing 600, the primer layer 624, the printing layer 625, and the top layer 626 may be sequentially laminated on a laminated printing area after the printing area is laminated through a delamination operation. According to an embodiment of the present disclosure, the first deposition layer 627 may be laminated on the bottom surface of the preform 620. According to an embodiment of the present disclosure, because the printing layer 625 printed through the delamination area uses the first deposition layer 627 formed on an opposite surface thereof through a transparent or semi-transparent preform 620 as the base thereof, a metallic color may also be achieved.

According to various embodiments of the present disclosure, because the bottom layer 621, the second deposition layer 622, the color paint layer 623, the primer layer 624, the printing layer 625, the top layer 626, and the first deposition layer 627 may be formed through the above-mentioned processes and of the above-mentioned materials, a detailed description thereof will be omitted.

Referring to FIG. 7, a metallic first deposition layer 727 provided as the base of a printing layer 723 or a metallic color paint layer may be laminated on a surface of the preform that is opposite to a surface on which a second deposition layer 724 is laminated. In this case, the preform 720 may be formed of a transparent or at least semi-transparent material. According to an embodiment of the present disclosure, while the second deposition layer 724 may be laminated on the upper surface of the preform 720, the first deposition layer 727 may be laminated on the bottom surface of the preform 720.

According to various embodiments of the present disclosure, the printing layer 723 may be laminated first on the bottom of the deposition color layer formed by the second deposition layer 724 and the color paint layer 725. According to an embodiment of the present disclosure, in the housing 700, after the bottom layer 721, the primer layer 722, the printing layer 723, the second deposition layer 724, and the color paint layer 725 are sequentially laminated on the preform 720, a top layer 726 may be laminated on a predetermined delaminated area after the predetermined area is delaminated as a printing layer exposure area. According to an embodiment of the present disclosure, the first deposition layer 727 may be laminated on the bottom surface of the preform 720. According to an embodiment of the present disclosure, because the printing layer 723 that is printed through the delamination area uses the first deposition layer 727 formed on an opposite surface thereof through a transparent or semi-transparent preform 720 as the base thereof, a metallic color may also be achieved.

According to various embodiments of the present disclosure, because the bottom layer 721, the primer 722, the printing layer 723, the second deposition layer 724, the color paint layer 725, the top layer 726, and the first deposition layer 727 may be formed through the above-mentioned processes and of the above-mentioned materials, a detailed description thereof will be omitted.

Figure 8:
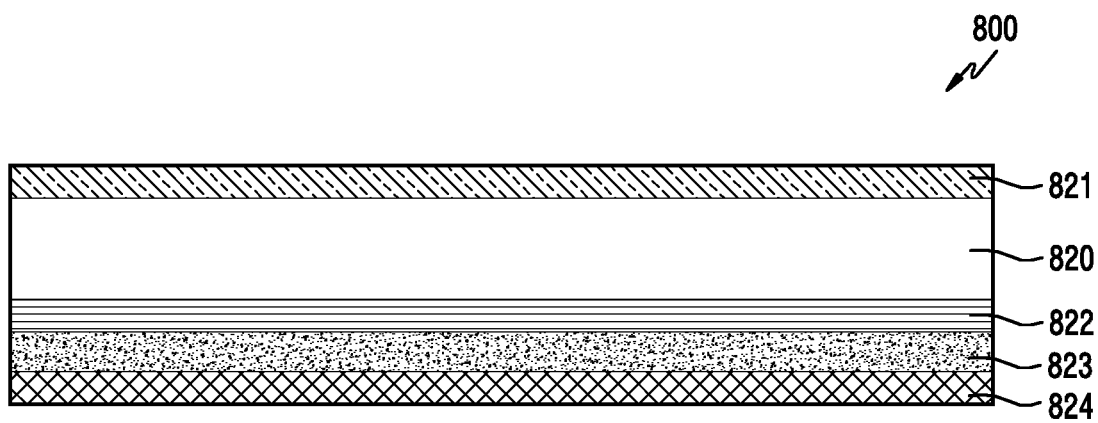
FIG. 8 is a diagram of an example of a housing cross-section, according to various embodiments of the present disclosure.

FIG. 8 is a diagram illustrating an example of a cross-section of a housing having a multiple color area, according to various embodiments of the present disclosure.

Referring to FIG. 8, a printing layer 822, a deposition layer 823, and a first paint layer 824 are sequentially laminated on a first surface of a preform 820, so that a metallic printing layer 822 that takes a deposition layer 823 as the base thereof may be viewed when viewed form a second surface that is opposite to the first surface of the preform 820. According to an embodiment of the present disclosure, a color paint layer may replace the deposition layer 823. According to an embodiment of the present disclosure, the color paint layer may be formed through silver color paint to give the housing a metallic look while taking the printing layer as the base thereof.

According to an embodiment of the present disclosure, the second surface may function as an outer surface of the housing 800, and the first surface may function as an inner surface of the housing 800. In this case, the preform 820 may be formed of a transparent or at least semi-transparent material.

According to various embodiments of the present disclosure, a second paint layer 821 may be further laminated on the second surface of the preform 820 to protect the preform 820 of a transparent material. According to an embodiment of the present disclosure, the second paint layer 821 may be formed of a hard coating layer having an anti-scratching property. According to an embodiment of the present disclosure, a transparent coating layer is further laminated on the deposition layer 823 as the first paint layer 824 to protect the deposition layer 823. According to an embodiment of the present disclosure, the transparent coating layer may also be formed of a urethane-based resin. According to various embodiments of the present disclosure, the printing layer 822, the deposition layer 823, the first paint layer 824, and the second paint layer 821 may be formed through the above-mentioned processes and the above-mentioned materials, and a detailed description thereof will be omitted.

According to various embodiments of the present disclosure, because two or more multiple color areas may be implemented in one housing and metallic color printing can be achieved with the base, the external appeal of the housing can be doubled.

FIGS. 1-8 are provided as an example only. At least some of the operations discussed with respect to these figures can be performed concurrently, performed in different order, and/or altogether omitted. It will be understood that the provision of the examples described herein, as well as clauses phrased as "such as," "e.g.", "including", "in some aspects," "in some implementations," and the like should not be interpreted as limiting the claimed subject matter to the specific examples.

Any of the functions and steps provided in the Figures may be implemented in hardware, software or a combination of both and may be performed in whole or in part within the programmed instructions of a computer. No claim element herein is to be construed under the provisions of 35 U.S.C. 112, sixth paragraph, unless the element is expressly recited using the phrase "means for".

While one or more embodiments have been described with reference to the figures, it will be understood by those of ordinary skill in the art that various changes in form and details may be made therein without departing from the spirit and scope as defined by the following claims.

What is claimed is:

1. A method for manufacturing a housing, comprising:
laminating three or more deposition layers on a first surface of a preform, the three or more deposition layers comprising a first deposition layer having a first color, a second deposition layer having a second color, and a third deposition layer having a third color, wherein the first layer is above the second deposition layer, and the second deposition layer is above the third deposition layer;
delaminating a first area of the first deposition layer having the first color, thereby leaving a remainder of the first deposition layer having the first color, and exposing the second deposition layer having the second color; and
delaminating a second area of the second deposition layer, wherein the second area is less than the first area, thereby leaving a remainder of the second deposition layer, and exposing the third deposition layer having the third color, wherein an exposed portion of the remainder of the second deposition layer is between the remainder of the first deposition layer and an exposed portion of the third deposition layer; and laminating a printing layer on the second area, wherein the remainder of the first layer surrounds the printing layer, wherein the printing layer comprises metallic material, wherein each of the first deposition layer, second deposition layer, and the third deposition layer is formed of at least one of a Sn-based material, a Ti-based material, a Cr-based material, and an Al-based material, and wherein the housing includes a protection cover to protect a smartphone.

2. The method of claim 1, wherein the delaminating of the first area and the second area is performed by using at least one of a fiber (diode) laser, a YAG laser, a gas laser, and an ultraviolet ray laser.

3. The method of claim 1, further comprising forming a primer layer in the second area and the remainder of the second deposition layer, wherein the primer layer is interposed between a top layer and a bottom layer.

4. The method of claim 1, further comprising forming a top layer above the remainder of the first area and the printing layer and forming a bottom layer and wherein the bottom layer includes a bottom color paint layer, and the bottom color paint layer is visible through at least some areas of the top layer.

5. The method of claim 1, further comprising forming a top layer on the first deposition layer, the first area, and the second area, the top layer having a different thickness over each of the first area, and the second area, and the first deposition layer.

6. The method of claim 5, wherein forming the top layer further comprises forming the top layer in contact with the remainder of the first deposition layer, the exposed portion of the remainder of the second deposition layer, and the exposed portion of the third deposition layer.

7. The method of claim 1, wherein the preform is formed of a light transmitting material.

8. The method of claim 7, wherein the preform is formed of a transparent or semi-transparent synthetic resin.

9. The method of claim 1, wherein the housing includes at least one of a case frame that defines an external appearance of the smartphone, and a battery cover that is installable on the case frame.

10. A method for manufacturing a housing, comprising:
laminating a first deposition layer on a preform;
laminating an intermediate layer on the first deposition layer;
laminating a second deposition layer on the intermediate layer;
applying a first color paint layer on the second deposition layer;
laminating a third deposition layer on the first color paint layer;
applying a second color paint layer on the third deposition layer;
delaminating at least some of the second color paint layer and the third deposition layer, thereby exposing the first color paint layer;
delaminating at least some of the first color paint layer and the second deposition layer to form at least one smooth and continuous delaminated area and leaving a remainder of the exposed first color paint layer, thereby exposing a portion the intermediate layer, and wherein the remainder of the exposed first color paint layer is between the delaminated at least some of the second color paint layer and the exposed portion of the intermediate layer;
forming a top layer in the delaminated area; and
forming a printing layer in the delaminated area, wherein the printing layer comprises metallic material, and wherein the first color paint layer surrounds the printing layer;
wherein the first deposition layer is visible through at least some areas of the top layer,
wherein the housing includes a protection cover to protect a smartphone, and
wherein each of the first deposition layer, second deposition layer, and the third deposition layer is formed of at least one of a Sn-based material, a Ti-based material, a Cr-based material, and an Al-based material.

* * * * *